United States Patent
Hayashi et al.

(10) Patent No.: US 12,550,389 B2
(45) Date of Patent: Feb. 10, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Hiroaki Hayashi, Tokyo (JP); Eiji Yagyu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 562 days.

(21) Appl. No.: 17/925,828

(22) PCT Filed: Jul. 8, 2020

(86) PCT No.: PCT/JP2020/026677
§ 371 (c)(1),
(2) Date: Nov. 17, 2022

(87) PCT Pub. No.: WO2022/009328
PCT Pub. Date: Jan. 13, 2022

(65) Prior Publication Data
US 2023/0178590 A1 Jun. 8, 2023

(51) Int. Cl.
*H10D 62/10* (2025.01)
*H10D 8/50* (2025.01)
(Continued)

(52) U.S. Cl.
CPC .......... *H10D 62/106* (2025.01); *H10D 8/50* (2025.01); *H10D 8/60* (2025.01); *H10D 48/021* (2025.01); *H10D 64/62* (2025.01)

(58) Field of Classification Search
CPC ......... H10D 62/106; H10D 8/60; H10D 8/051
See application file for complete search history.

(56) References Cited

U.S. PATENT DOCUMENTS 5,914,500 A  6/1999  Bakowski et al.
7,388,187 B1 *  6/2008  Liu .................. H10F 39/186
                                              257/435

(Continued)

FOREIGN PATENT DOCUMENTS

JP    52-72581 A    6/1977
JP    56-83076 A    7/1981
(Continued)

OTHER PUBLICATIONS

International Search Report and Written Opinion mailed on Sep. 29, 2020, received for PCT Application PCT/JP2020/026677, filed on Jul. 8, 2020, 12 pages including English Translation.

(Continued)

*Primary Examiner* — Wasiul Haider
(74) *Attorney, Agent, or Firm* — XSENSUS LLP

(57) ABSTRACT

An object is to provide a technique that ensures to reduce a parasitic resistance of a semiconductor device while enhancing a breakdown voltage property of a semiconductor device. A portion of a second semiconductor layer exposed from a first semiconductor layer corresponds to a concave portion of a laminated structure and the first semiconductor layer or an adjacent portion of the first semiconductor layer and a second semiconductor layer corresponds to a convex portion of the laminated structure. A first guard ring of a second conductivity type is arranged on side walls of the convex portion, and in the concave portion, a guard ring of the second conductivity type is not arranged, or a second guard ring of the second conductivity type having a thickness thinner than that of the first guard ring is arranged.

11 Claims, 19 Drawing Sheets

(51) Int. Cl.
  *H10D 8/60* (2025.01)
  *H10D 48/01* (2025.01)
  *H10D 64/62* (2025.01)

(56) References Cited

U.S. PATENT DOCUMENTS

| | | | |
|---|---|---|---|
| 7,935,983 B2 * | 5/2011 | Saito | H10D 30/4755 |
| | | | 257/E51.015 |
| 8,164,154 B1 | 4/2012 | Tanielian et al. | |
| 2006/0145283 A1 | 7/2006 | Zhu et al. | |
| 2007/0108547 A1 * | 5/2007 | Zhu | H10D 30/6738 |
| | | | 257/E29.253 |
| 2012/0256192 A1 * | 10/2012 | Zhang | H10D 8/60 |
| | | | 257/481 |
| 2014/0284615 A1 | 9/2014 | Mauder et al. | |

FOREIGN PATENT DOCUMENTS

| | | |
|---|---|---|
| JP | 9-260688 A | 10/1997 |
| JP | 2001-508950 A | 7/2001 |
| JP | 2009-516391 A | 4/2009 |
| JP | 2009-194225 A | 8/2009 |
| JP | 2012-195618 A | 10/2012 |
| JP | 2013-153185 A | 8/2013 |
| JP | 2014-187364 A | 10/2014 |
| WO | 98/32178 A1 | 7/1998 |
| WO | 2007/059035 A2 | 5/2007 |

OTHER PUBLICATIONS

Schmitz et al., "Metal Contacts to n-Type GaN", Journal of Electronic Materials, vol. 27, No. 4, Special Issue Paper, 1998, pp. 225-260.

Subramaniam et al., "Electrical Characteristics of Schottky Contacts on GaN and Al0.11Ga0.89N", Japanese Journal of Applied Physics, vol. 39 (2000), Part-2, No. 4B, The Japan Society of Applied Physics, Apr. 15, 2000, pp. L351-L353.

* cited by examiner

F I G. 2
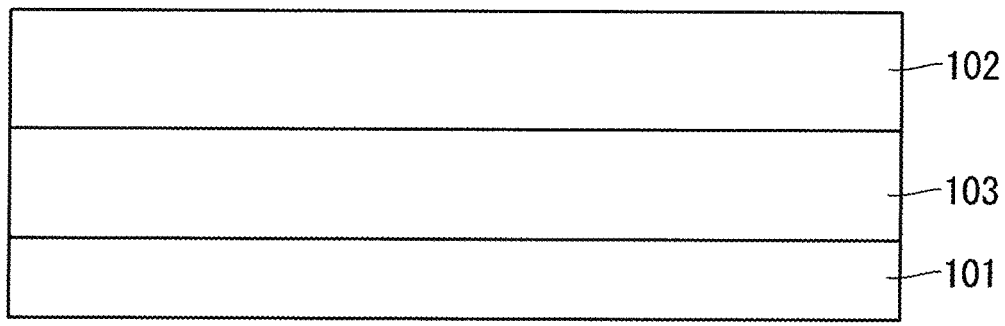

F I G. 7
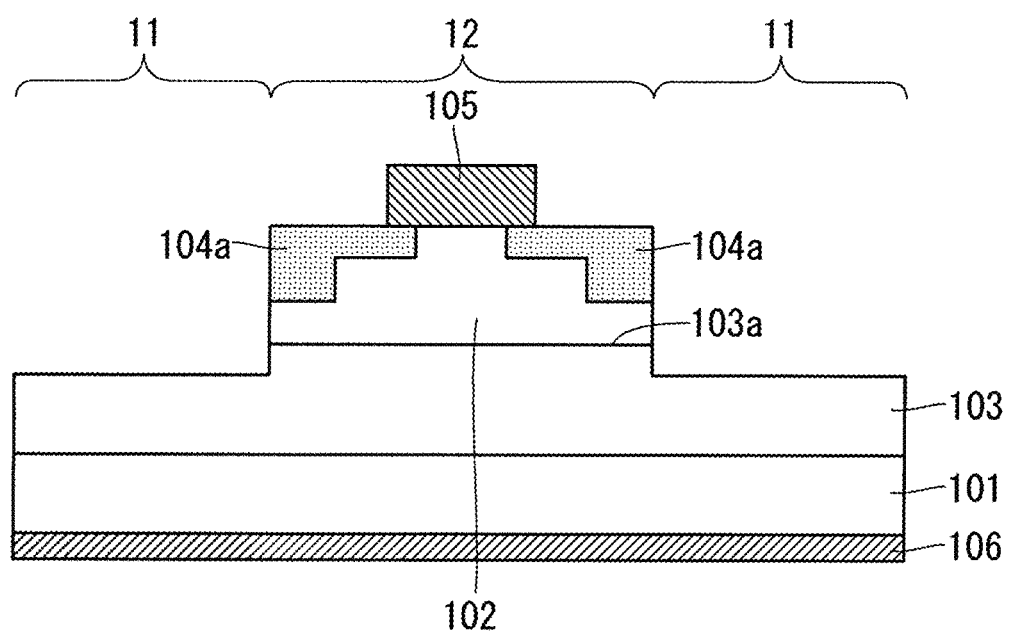

F I G. 1 5
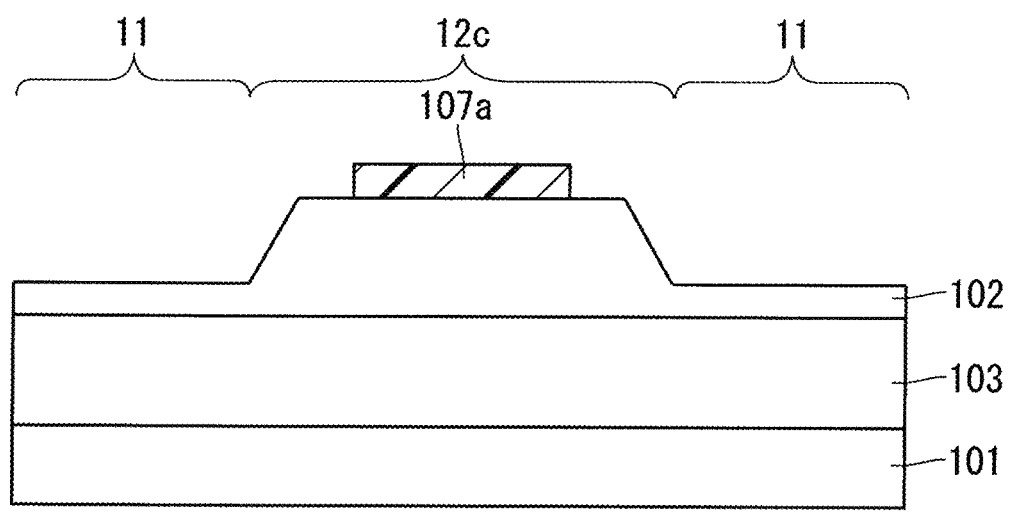

F I G. 1 7
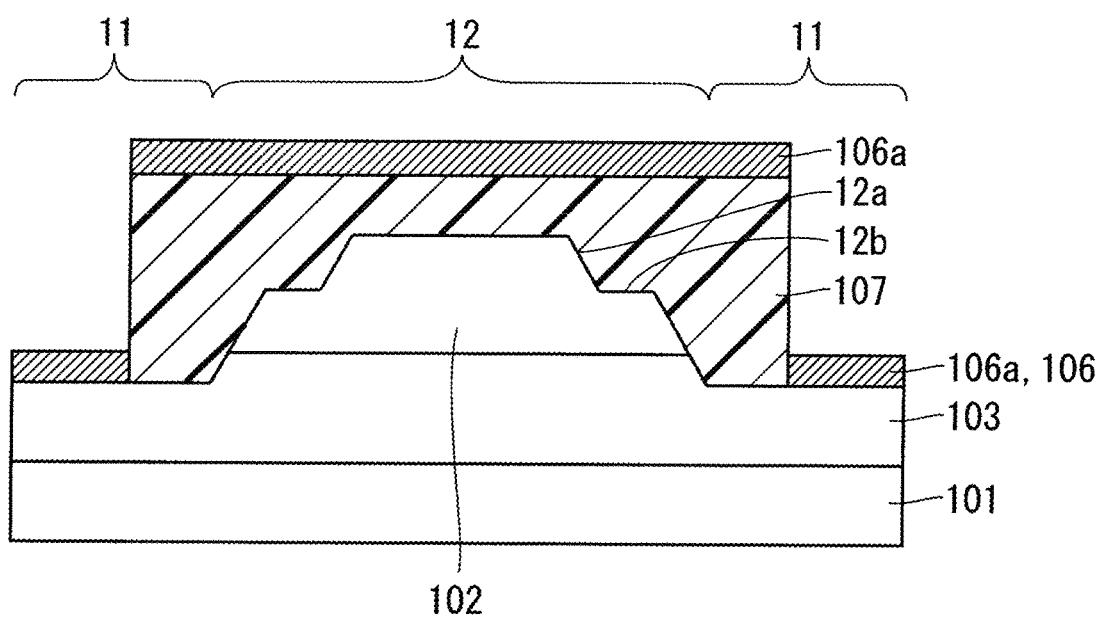

F I G. 1 8
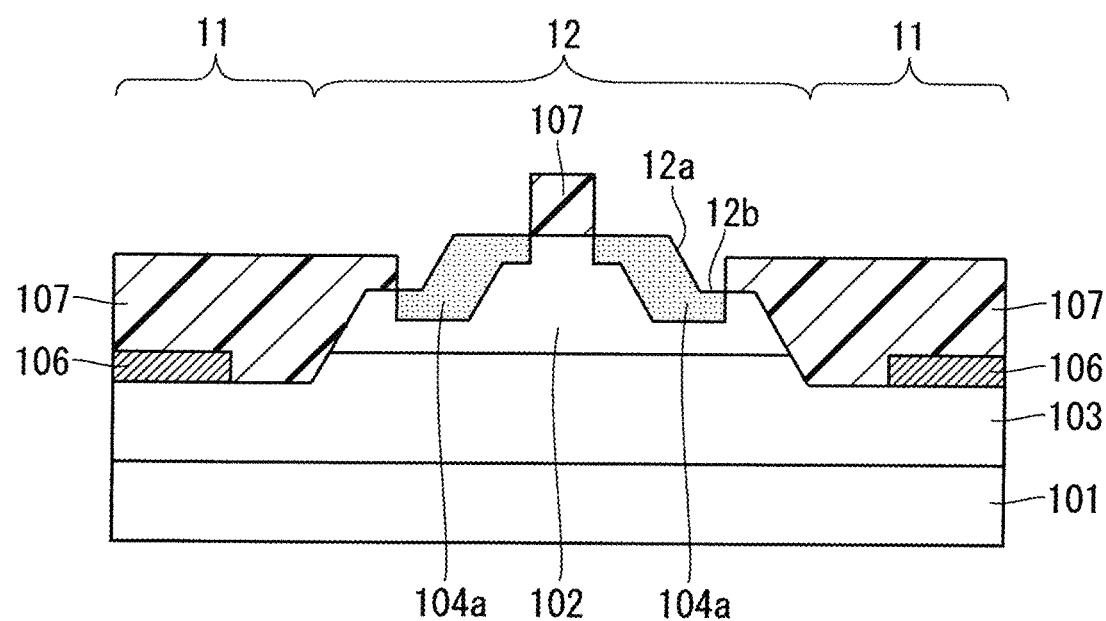

F I G. 1 9
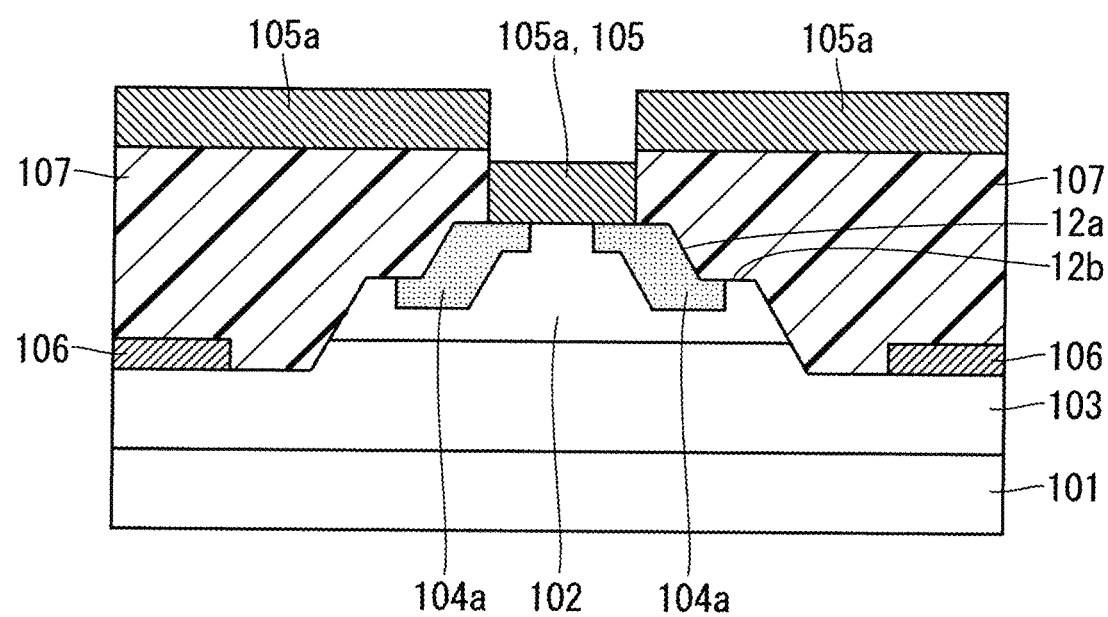

SEMICONDUCTOR DEVICE AND METHOD OF MANUFACTURING SEMICONDUCTOR DEVICE

CROSS-REFERENCE TO RELATED APPLICATION

The present application is based on PCT filing PCT/JP2020/026677, filed Jul. 8, 2020, the entire contents of which are incorporated herein by reference.

TECHNICAL FIELD

The present disclosure relates to a semiconductor device and a method of manufacturing the semiconductor device.

BACKGROUND ART

Schottky barrier diodes, which are monopolar elements, can operate at high speed, and are useful as rectifier diodes that determine the efficiency of rectifier circuits. Meanwhile, in a Schottky barrier diode, the leakage current during reverse operation is large and the reverse breakdown voltage is low because the Schottky barrier at the interface between a semiconductor and a metal is used as a barrier.

Various methods have been devised as methods for improving reverse characteristics. Patent Document 1 proposes, for example, a high breakdown voltage element structure using a field plate, and Patent Document 2, for example, proposes a high breakdown voltage element structure using a guard ring. Also, for example, Patent Document 3 proposes a technique of suppressing an increase in parasitic resistance and improving breakdown voltage by pinching off from the periphery using two types of Schottky electrodes.

PRIOR ART DOCUMENTS

Patent Document(s)

[Patent Document 1] Japanese Patent Application Laid-Open No. 56-83076
[Patent Document 2] Japanese Patent Application Laid-Open No. 52-72581
[Patent Document 3] Japanese Unexamined Patent Application Publication (Translation of PCT Application) No. 2009-516391

SUMMARY

Problem to be Solved by the Invention

It has been known that, with a conventional Schottky barrier diode, a voltage lower than the breakdown voltage expected from the physical properties of the material causes malfunction such as a breakdown of the semiconductor device during the inspection. The malfunction is derived from insufficient progress of depletion due to defects caused by processing or film formation, and due to a high electric field applied to the pattern edge due to the processed shape. In order to avoid this, it is conceivable to arrange structures such as a guard rings and a field plate. However, element characteristics deteriorate in these structures because of an increase in parasitic resistance due to dopant infiltration into an access layer, an increase in electrode area, and an increase in parasitic capacitance due to junction formation. Also, in the technique of Patent Document 3, obtaining a sufficient difference in barrier and depletion layer widths between the two types of electrodes is difficult to achieve due to the influence of pinning.

The present disclosure has been made in view of the aforementioned issues, and it is an object of the present invention to provide a technique that ensures in reduction of the parasitic resistance of a semiconductor device while enhancing the breakdown voltage property of the semiconductor device.

Means to Solve the Problem

According to the present disclosure, a semiconductor device includes a first semiconductor layer of a first conductivity type, and a second semiconductor layer of the first conductivity type having impurity concentration of the first conductivity type higher than that of the first semiconductor layer and having an adjacent portion being a portion adjacent to the first semiconductor layer, the portion being covered by the first semiconductor layer, in which a portion of the second semiconductor layer exposed from the first semiconductor layer corresponds to a concave portion of a laminated structure of the first semiconductor layer and the second semiconductor layer, the first semiconductor layer or the first semiconductor layer and the adjacent portion of the second semiconductor layer corresponds to a convex portion of the laminated structure, a first guard ring of a second conductivity type is arranged on side walls of the convex portion, and in the concave portion, a guard ring of the second conductivity type is not arranged, or a second guard ring of the second conductivity type having a thickness thinner than that of the first guard ring is arranged.

Effects of the Invention

According to the present disclosure, the first guard ring is arranged on side walls of the convex portion, and in the concave portion, a guard ring is not arranged, or a second guard ring having a thickness thinner than that of the first guard ring is arranged. According to such a configuration, the reduction in the parasitic resistance of the semiconductor device is ensured while enhancing the breakdown voltage property of the semiconductor device.

The objects, features, aspects, and advantages of the present disclosure will become more apparent from the following detailed description and the accompanying drawings.

BRIEF DESCRIPTION OF DRAWINGS

FIG. 2 A schematic cross-sectional view for illustrating a method of manufacturing the semiconductor device according to the first embodiment.

FIG. 7 A schematic cross-sectional view illustrating a configuration of a semiconductor device according to a second embodiment.

FIG. 15 A schematic cross-sectional view for illustrating the method of manufacturing the semiconductor device according to the sixth embodiment.

FIG. 17 A schematic cross-sectional view for illustrating the method of manufacturing the semiconductor device according to the sixth embodiment.

FIG. 18 A schematic cross-sectional view for illustrating the method of manufacturing the semiconductor device according to the sixth embodiment.

FIG. 19 A schematic cross-sectional view for illustrating the method of manufacturing the semiconductor device according to the sixth embodiment.

DESCRIPTION OF EMBODIMENT(S)

Figure 1:
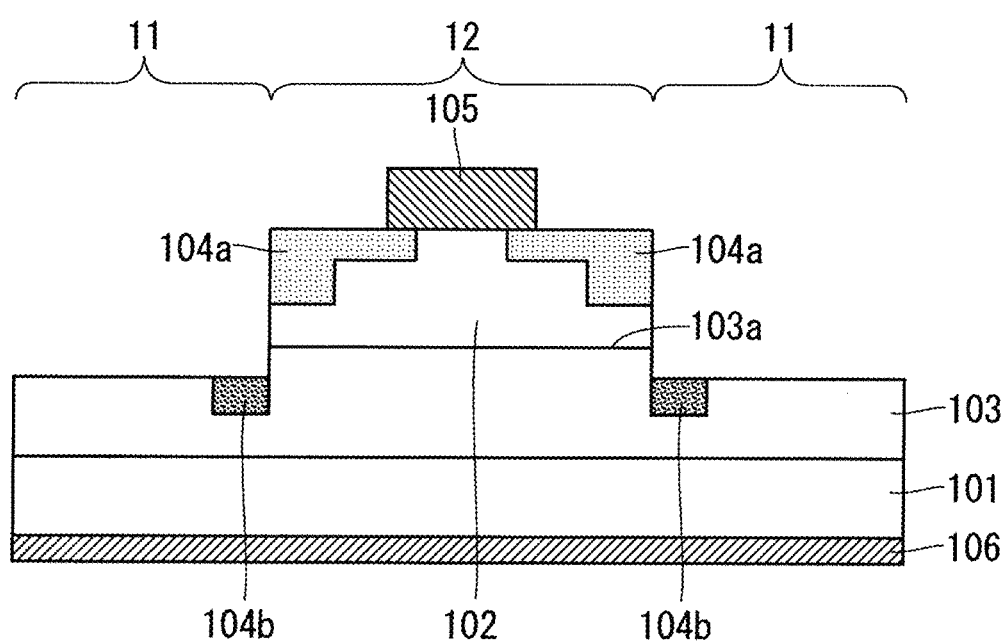
FIG. 1 A schematic cross-sectional view illustrating a configuration of a semiconductor device according to a first embodiment.

Hereinafter, the embodiments will be described with reference to the attached drawings. It should be noted that the embodiments will not make a limitation on the present disclosure, appropriate changes can be made as long as the purpose thereof is not deviated, and should be broadly interpreted in accordance with the scope of the claims. In addition, although in the drawings described below, part of each layer or each member is omitted for ease of understanding, and the scale of each layer or each member may not coincide with the reality, the scope of the present disclosure is not limited by the drawings.

First Embodiment

FIG. 1 is a schematic cross-sectional view illustrating a configuration of a semiconductor device according to a first embodiment. In the following, the semiconductor device is assumed to be a Schottky barrier diode, however, the semiconductor device is not limited thereto, and may be a pn diode, for example. Also in the following, the description is made assuming the semiconductor device and the semiconductor element are substantially the same. Although in the following description, n-type and p-type represent the first conductivity type and the second conductivity type, respectively, the first conductivity type and the second conductivity type may be represented by p-type and n-type, respectively.

An access layer 103 of an n-type conductivity type is arranged on a semiconductor substrate 101, and an n-type drift layer 102 having the same conductivity type as the access layer 103 is arranged on the access layer 103. That is, the semiconductor substrate 101 is arranged on the portion of the access layer 103 on an opposite side to the drift layer 102, and the access layer 103 is arranged between the semiconductor substrate 101 and the drift layer 102.

The n-type impurity concentration of the access layer 103 being a second semiconductor layer is higher than the n-type impurity concentration of drift layer 102 being a first semiconductor layer. The access layer 103 has an adjacent portion 103a which is a portion covered with the drift layer 102 and adjacent to the drift layer 102.

Portions of the access layer 103 exposed from the drift layer 102 correspond to concave portions of the laminated structure of the drift layer 102 and the access layer 103. The drift layer 102 or the drift layer 102 and the adjacent portion 103a of the access layer 103 corresponds to a convex portion of the laminated structure of the drift layer 102 and the access layer 103.

Although in the following description, the concave portions are referred to as flat portions 11, the concave portions are not necessarily flat portions and may be portions having some irregularities. Also, although in the following description, the convex portion is referred to as a mesa portion 12, the convex portion does not necessarily have a mesa shape.

An anode electrode 105 being a first electrode is arranged on the mesa portion 12, that is, on the upper surface of drift layer 102. The connection between the anode electrode 105 and the drift layer 102 is preferably Schottky contact, and Ni (nickel), Ti (titanium), Pt (platinum), or the like are typically used as the material of the anode electrode 105, for example. Here, the description is made that the material of the anode electrode 105 is Pt. When the material of the anode electrode 105 is Pt, Schottky contact can be established if the concentration of the drift layer 102 is $4.8 \times 10^{17}$ cm$^{-3}$.

A cathode electrode 106 being a second electrode is arranged on the lower surface of the semiconductor substrate 101. An ohmic contact is preferable for the connection between the cathode electrode 106 and the semiconductor substrate 101. The cathode electrode 106 may be arranged on the lower surface of the access layer 103 by processing the semiconductor substrate 101, or may be arranged on the upper surface of the access layer 103, that is, on the flat portions 11 as described in other embodiments.

According to the above configuration, even if a high voltage is applied to the semiconductor device, depletion progresses from the surface of the drift layer 102, and the electric field is reduced, so that the malfunction due to the electric field (voltage) is preventable. Here, reduction of the electric field to be applied to the drift layer 102 requires a further extension of the depletion layer. Reducing the concentration of the drift layer 102 is effective to extend the depletion layer, and the concentration therefor should be set according to the required breakdown voltage of the semiconductor device. For example, if the breakdown voltage is set to 60 V, the carrier concentration of the drift layer 102 is preferably $4.8 \times 10^{17}$ cm$^{-3}$ or less.

However, in the above configuration, the depletion not proceeding sufficiently due to defects caused by processing and film formation, or a high electric field being applied to the pattern edge included in the processed shape may cause malfunction in the semiconductor device.

As a countermeasure therefor, attempts have been made to reduce the electric field applied to the surface of the semiconductor layer by arranging a guard ring on the surface of the semiconductor layer. The guard ring forms a bonding with the semiconductor layer by including a p-type semiconductor composed of p-type impurities at a high concentration different from the semiconductor layer such as the n-type drift layer 102.

Here, the guard ring may be devised to deactivate carriers generated by processing damage. When this device is applied, the concentration of the guard ring is preferably a carrier concentration of, for example, $5.0 \times 10^{17}$ cm$^{-3}$ or less. With such a configuration, the effect of reducing the electric field can be obtained by extending the depletion layer toward the low-concentration semiconductor layer when a voltage is applied to the semiconductor device. As a result, the suppression of the electric field in the semiconductor device from reaching the material breakdown electric field is ensured, thereby suppressing malfunction in the semiconductor device.

In actual driving thereof, the influence of processing damage is relatively large, and the portion that becomes a structural singularity is the side walls of the mesa portion 12 having the pattern edge. As a result, it is considered that malfunction occurs when depletion is inhibited at the sidewalls of the mesa portion 12 which is supposed to be depleted during operation, and a high electric field is applied to the semiconductor device.

Therefore, in the first embodiment, a first guard ring 104a of p-type is provided on the side walls of the mesa portion 12, thereby suppressing the above-described malfunction of the semiconductor device.

Meanwhile, arranging a deep guard ring in the flat portions 11, where there is substantially no processing damage and no singularity, narrows the current path and increases the parasitic resistance. In other words, arranging the guard ring in the flat portions 11 increases the parasitic capacitance, depending on the type of guard ring and the type of field plate. However, when the first guard ring 104a is formed on the side wall of the mesa portion 12, the guard ring may be formed not only on the upper surface and side walls of the mesa portion 12, but also on the flat portions 11 of the access layer 103 due to the limitation of the patterning precision unless a certain device is elaborated.

Therefore, in the first embodiment, a second guard ring 104b of p-type having a thickness thinner than that of the first guard ring 104a on the side walls of the mesa portion 12 is arranged in flat portions 11. That is, the length between the surface and the deep portion of the first guard ring 104a of the side wall of the mesa portion 12 is greater than the length between the surface and the deep portion of the second guard ring 104b of flat portion 11. In this manner, the first guard ring 104a on the side walls of the mesa portion 12 is arranged relatively deep and has processing damages, so that the effect of protecting the side walls of the mesa portion 12, which becomes a structural singularity, is enhanced, and this improves the electric field relaxation and breakdown voltage of the semiconductor device. On the other hand, the second guard ring 104b of the flat portions 11 is arranged only to a relatively shallow depth; therefore, the suppression of the infiltration of the second guard ring 104b into the high-concentration and low-resistance access layer 103 is ensured, suppressing the increase in parasitic resistance and parasitic capacitance of the semiconductor device.

<Manufacturing Method>

FIGS. 2 to 6 are schematic cross-sectional views for illustrating a method of manufacturing the semiconductor device according to the first embodiment. Next, the method of manufacturing the semiconductor device according to the first embodiment will be described. Here, although an example in which the material of the semiconductor substrate 101 and the like is a nitride semiconductor will be described, the material is not limited to the nitride semiconductor, and other semiconductor materials such as a wide bandgap semiconductor may also be adopted. In addition, the example described below is merely an example for helping understanding of the present disclosure, and do not limit the manufacturing method, the order of manufacturing steps, and the like. Also, in order to simplify the description, the description of the configuration of a passivation film, a wiring, a field plate and the like. Is omitted, but the presence or absence thereof does not affect the gist of the present disclosure.

First, as illustrated in FIG. 2, the access layer 103 such as an n$^+$-GaN layer is formed on the semiconductor substrate 101 by epitaxial growth. Here, a buffer layer may be arranged between the semiconductor substrate 101 and the access layer 103 to facilitate subsequent crystal growth and secure crystal quality. Known epitaxial growth apparatuses include, for example, a metal organic chemical vapor deposition (MOCVD) apparatus, a molecular beam epitaxy (MBE) apparatus, and a hydride vapor phase epitaxy (HVPE) apparatus, any of which may be used. When forming an n$^+$-GaN layer by MOCVD, for example, trimethylgallium (TMG) or triethylgallium (TEG) is used as the source gas for Ga, ammonia (NH$_3$) is used as the source gas for N, and monosilane (SiH$_4$) is used as the source gas for Si to be doped.

When an n$^+$-GaN substrate is used as the semiconductor substrate 101, the step of film forming for the access layer 103 may be omitted. In this case, the semiconductor substrate 101 is used as the access layer 103.

Also, the drift layer 102 such as an n$^-$-GaN layer is formed on the access layer 103 by epitaxial growth. The access layer 103 and the drift layer 102 are to be layers that determine the breakdown voltage of the semiconductor device; therefore, their impurity concentrations and film thicknesses must be precisely controlled.

Figure 3:
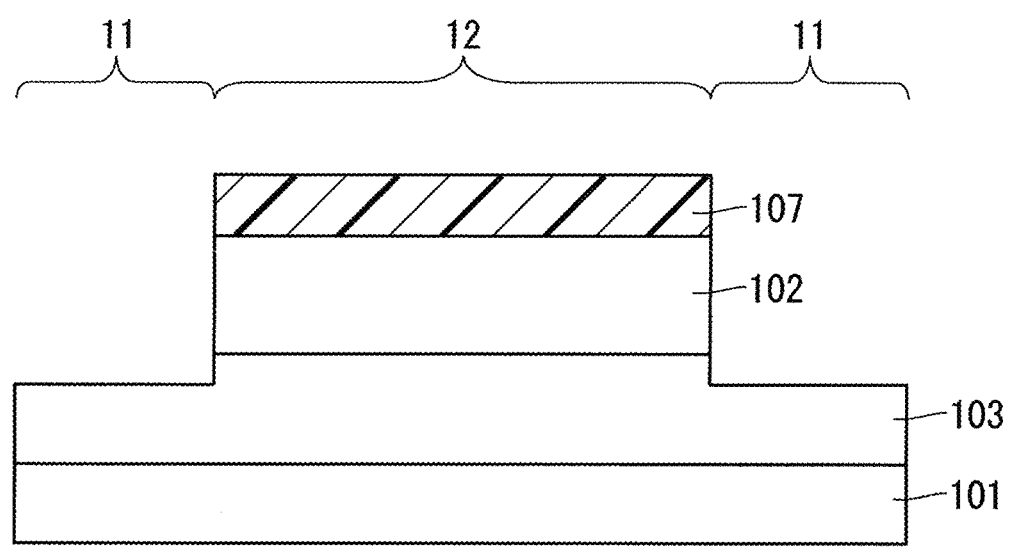
FIG. 3 A schematic cross-sectional view for illustrating the method of manufacturing the semiconductor device according to the first embodiment.

Then, as illustrated in FIG. 3, the access layer 103 is partially exposed from the drift layer 102 to form the mesa portion 12 and the flat portions 11. As a patterning method to expose the access layer 103, for example, photolithography, electron beam lithography, laser drawing, imprinting, or the like is used. In FIG. 3, the mesa portion 12 and the flat portions 11 are formed by patterning a photoresist 107 using a photomask and by photolithography, and selectively etching the drift layer 102 using the patterned photoresist 107 as a mask.

Figure 4:
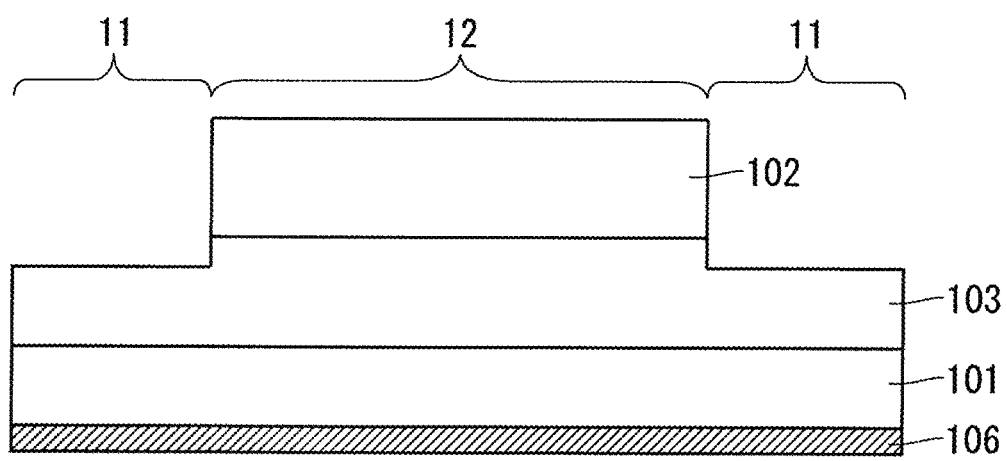
FIG. 4 A schematic cross-sectional view for illustrating the method of manufacturing the semiconductor device according to the first embodiment.

Next, as illustrated in FIG. 4, the cathode electrode 106 is formed on the lower surface of the semiconductor substrate 101. An ohmic contact is preferable for the connection between the cathode electrode 106 and the semiconductor substrate 101. In order to obtain an ohmic contact in the exemplified nitride semiconductor, the lower surface of the semiconductor substrate 101 may be previously subjected to ion implantation and activation annealing treatment, or subjected to alloy treatment after forming an electrode such as the cathode electrode 106. In the case of nitride semiconductors, for example, the activation annealing treatment and the alloy treatment often involve high temperatures, and after the guard ring is formed, the characteristics of the guard ring may change due to the heat history at the time. In order to suppress such change, the guard ring is preferably formed after forming the cathode electrode 106, as described below.

Figure 5:
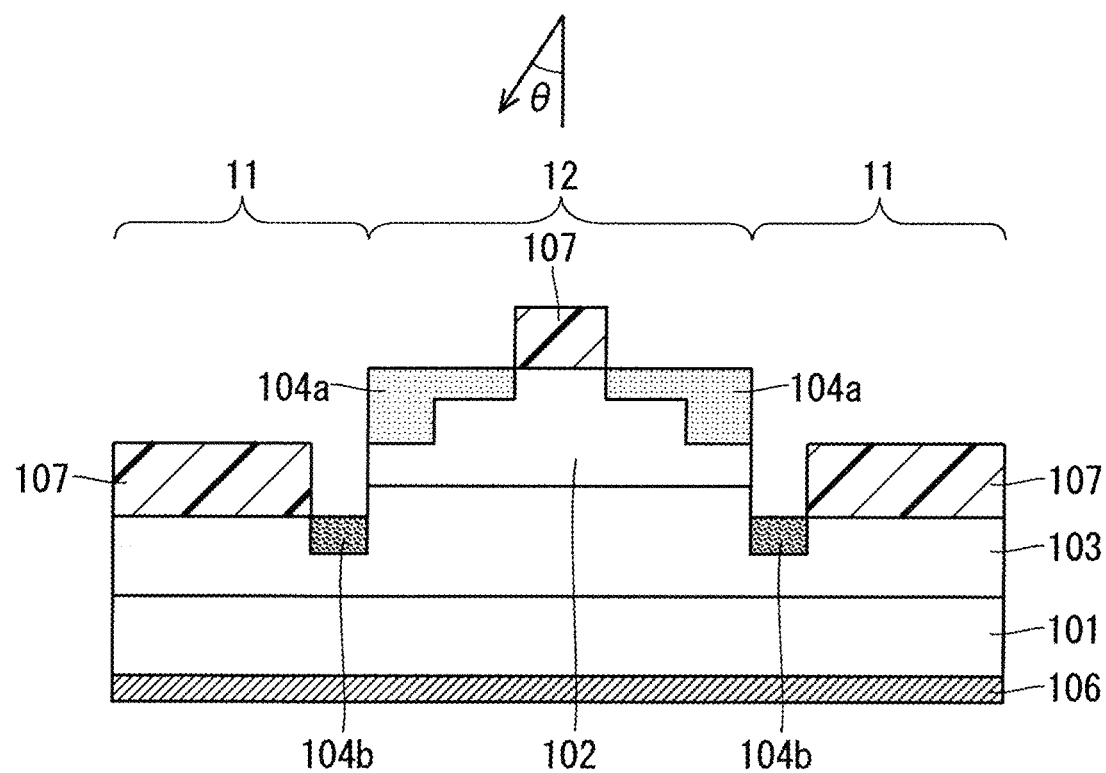
FIG. 5 A schematic cross-sectional view for illustrating the method of manufacturing the semiconductor device according to the first embodiment.

Then, as illustrated in FIG. 5, the photoresist 107 exposing the mesa portion 12 is patterned using a photomask and by photolithography. At this time, a non-implantation region of the mesa portion 12, which is not supposed to be ion-implanted, is set as a non-exposed region of the photomask, so that the photoresist 107 can be left in the non-implantation region. In the example of FIG. 5, the upper surface of the mesa portion 12 includes a non-implanted upper surface region where the photoresist 107 remains and an implanted upper surface region where the photoresist 107 does not remain. Also in the example of FIG. 5, parts of the flat portions 11 are unintentionally exposed between the side walls of the mesa portion 12 and the photoresists 107 on the flat portions 11 due to the patterning accuracy of the photoresist 107.

Next, ions being p-type impurities are implanted. In the first embodiment, the tilt angle θ formed between the direction of ion implantation and the out-of-plane direction of the drift layer 102 is 30° or more in cross-sectional view.

Of the mesa portion 12, ions are implanted only in the exposed region that is not covered with the photoresist 107 described above. Ions are not implanted in the region shielded by the photoresist 107, which has a thickness greater than the stopping power when viewed from the direction of the ion source. As a result, ions are implanted into the side walls and the implanted upper surface region of the mesa portion 12 and the like to form the first guard ring 104a.

In the flat portions 11 of the access layer 103, ions are implanted from the same ion source as the ion implantation for the mesa portion 12, however, the side walls of the mesa portion 12 and the flat portions 11 differ in ion penetration depth from the surface because the side walls of the mesa portion 12 and the flat portion 11 are different in implantation angle, surface density, and surface spacing. The penetration depth of ions in the flat portion 11 is affected by the tilt angle θ, while the penetration depth of ions in the side wall of the mesa portion 12 is affected by the tilt angle θ and the mesa taper being the inclination angle of the side wall of. Therefore, by appropriately controlling the mesa taper angle and the tilt angle θ, the ion penetration depths of the side walls of the mesa portion 12 and the flat portions 11 can be individually set, and this allows the thickness of the second guard ring 104b of the flat portions 11 to be made smaller than the thickness of the first guard ring 104a of the side walls of the mesa portion 12. The same applies to the side walls of the mesa portion 12 and the implanted upper surface region.

It should be noted that if the rotation angle, which is the wafer rotation angle, is set to a single value and ion implantation is performed from only one direction, shading in which the mesa portion 12 and the photoresist 107 hinder ion implantation may occur in some cases depending on the tilt angle θ. For this reason, it is preferable to perform ion implantation at at least two rotation angles with respect to the longitudinal direction of the mesa portion 12, or to perform ion implantation while rotating the wafer.

Also, when the tilt angle θ is 90°, the ion implantation direction becomes parallel to the upper surface of the drift layer 102 and the like, making it impossible to perform the ion implantation on the upper surface of the drift layer 102 and the like. In view of this, the tilt angle θ is preferably 60° or less.

Although the manufacturing method for forming the guard ring by ion implantation has been described above, the manufacturing method is not limited thereto. For example, a guard ring may be formed by depositing a doping-controlled crystal. In the above, although the manufacturing method in which a guard ring deeper than that of the flat portions 11 is formed on the side walls of the mesa portion 12 by exposing the side walls of the mesa portion 12 and performing oblique ion implantation has been described, the method is not limited thereto. For example, a guard ring deeper than that of the flat portions 11 may be formed on the side walls of the mesa portion 12 using the plane orientation and mass transport during crystal growth.

Figure 6:
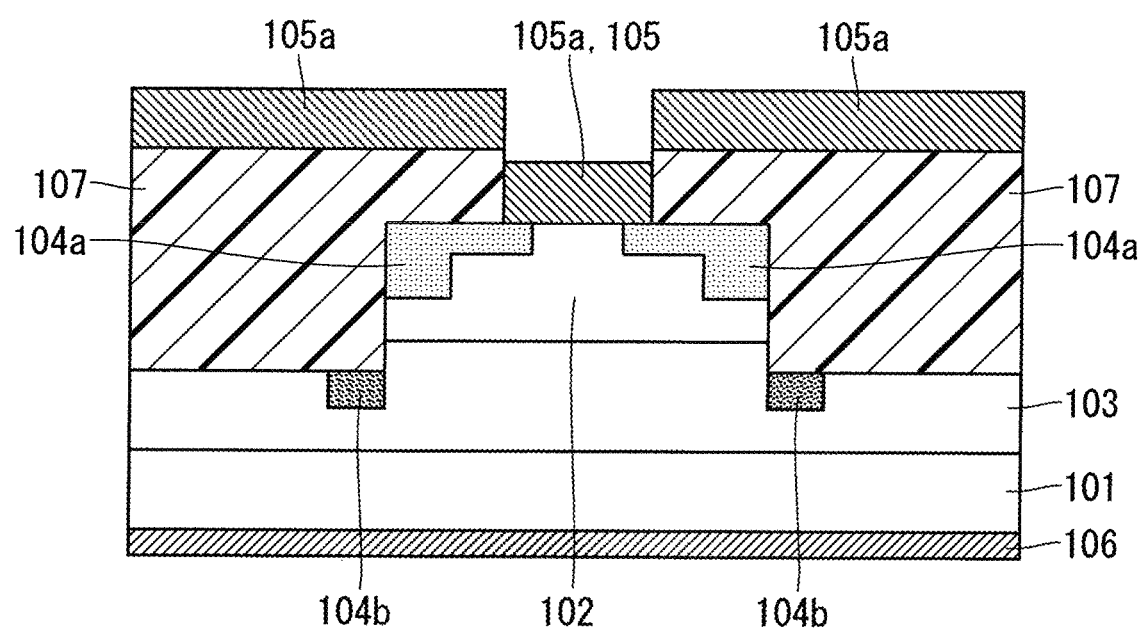
FIG. 6 A schematic cross-sectional view for illustrating the method of manufacturing the semiconductor device according to the first embodiment.

The anode electrode 105 is then formed on the non-implanted upper surface region of the drift layer 102, as illustrated in FIG. 6. The connection between the anode electrode 105 and the drift layer 102 is preferably Schottky contact. Note that the anode electrode 105 is formed by lifting-off in FIG. 6. In this lifting-off, the photoresist 107 or a dielectric such as SiN or SiO is used as a mask, and the metal 105a is deposited thereon by vapor deposition or sputtering. Then, by removing the metal 105a on the mask at the same time as removing the mask, the metal 105a in the region without the mask is patterned as the anode electrode 105. Patterning of the electrode is not limited to this lifting-off, and known methods such as ion milling, dry processing, and wet processing can also be used.

<Summary of First Embodiment>

According to the first embodiment as described above, the first guard ring 104a on the side walls of the mesa portion 12 is arranged relatively deep; therefore, enhancement in the electric field relaxation and breakdown voltage property of the semiconductor device is ensured. Meanwhile, the second guard ring 104b of the flat portions 11 is arranged only relatively shallow; therefore, suppression of an increase in parasitic resistance and parasitic capacitance of the semiconductor device is ensured.

Further, in the first embodiment, the tilt angle θ being 30° or more allows to ensure that the depths of the first guard ring 104a and the second guard ring 104b, and the depths of the side walls of the mesa portion 12 and the implanted upper surface region are appropriately controlled.

Second Embodiment

FIG. 7 is a schematic cross-sectional view illustrating a configuration of a semiconductor device according to a second embodiment. The second embodiment is obtained by changing the configuration of the guard ring in the configuration of the first embodiment, and the changes will be mainly described below.

In the second embodiment, no guard ring is provided on flat portions 11 of the access layer 103. Therefore, an increase in the resistance of the semiconductor device when a voltage is applied in the forward direction can be suppressed, and an increase in the parasitic capacitance of the access layer 103 is also suppressed. However, as described in the first embodiment, when the first guard ring 104a is formed on the side walls of the mesa portion 12, the guard ring is also to be formed in the flat portions 11 of access layer 103 due to limitations in patterning accuracy, unless a certain device is elaborated. Therefore, in the second embodiment, the manufacturing method described in the first embodiment is added with a certain device.

<Manufacturing Method>

Figure 8:
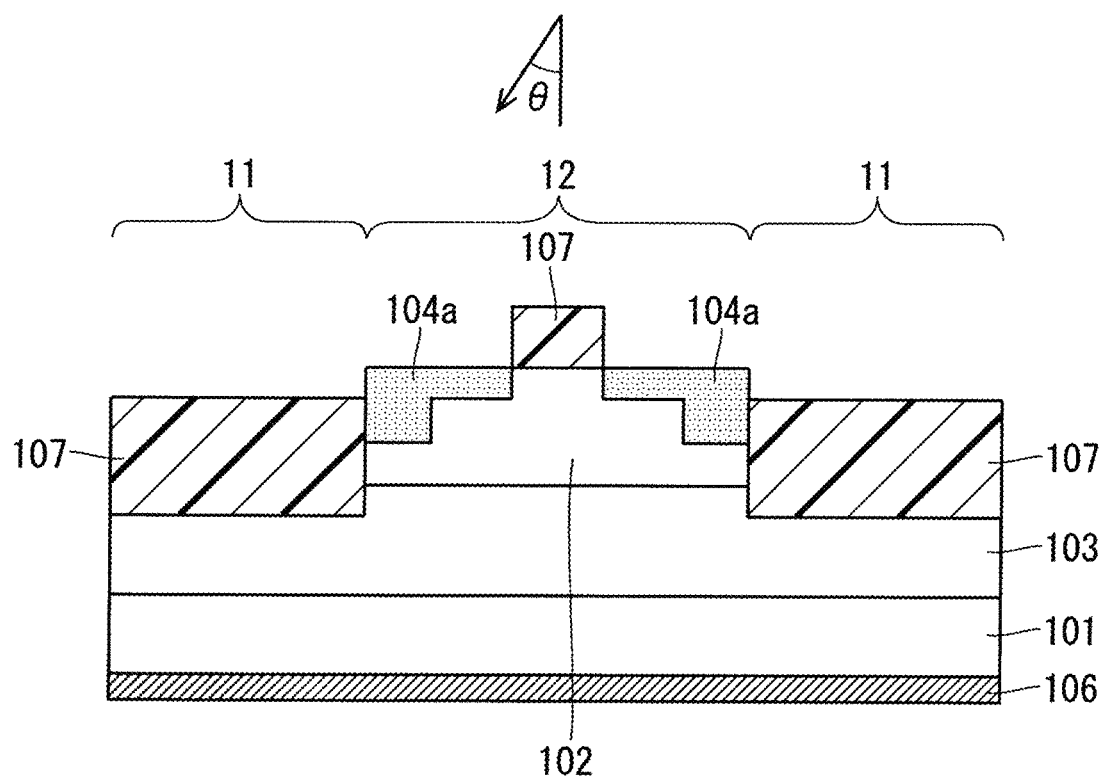
FIG. 8 A schematic cross-sectional view for illustrating a method of manufacturing the semiconductor device according to the second embodiment.
Figure 9:
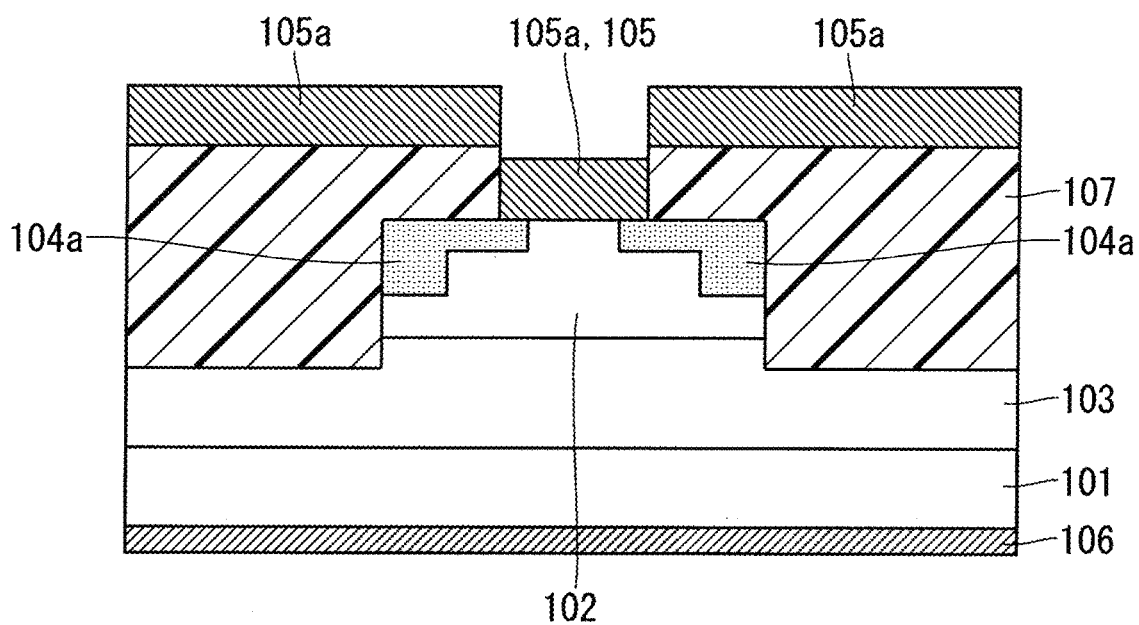
FIG. 9 A schematic cross-sectional view for illustrating the method of manufacturing the semiconductor device according to the second embodiment.

FIGS. 8 to 9 are schematic cross-sectional views for illustrating a method of manufacturing the semiconductor device according to the second embodiment. Next, the method of manufacturing the semiconductor device according to the second embodiment will be described.

First, the same steps as those illustrated in FIGS. 2 to 4 of the first embodiment are performed. Then, the photoresist 107 is spin-on coated to cover the mesa portion 12, and the upper surface of the photoresist 107 is flattened. Next, the depth of development is controlled by light exposure. Specifically, the table top, which is the upper surface of the mesa portion 12, is to be fully exposed and the flat portions 11 which are not to be exposed are subject to underexposure in which the light exposure is adjusted lower than normal.

After development, as illustrated in FIG. 8, only the upper portion of the mesa portion 12 is exposed from the photoresist 107, while the photoresist 107 on the flat portions 11 has a residual film thickness controlled by the light exposure amount. At this time, a non-implantation region of the mesa portion 12, which is not supposed to be ion-implanted, is set as a non-exposed region of the photomask, so that the photoresist 107 can be left in the non-implantation region. As with the same with the example of FIG. 5, in the example of FIG. 8, the upper surface of the mesa portion 12 includes a non-implanted upper surface region where the photoresist 107 remains and an implanted upper surface region where the photoresist 107 does not remain.

Next, ions being p-type impurities are implanted. The tilt angle θ according to the second embodiment is 30° or more as with the first embodiment.

Of the mesa portion 12, ions are implanted only in the exposed region that is not covered with the photoresist 107 described above. Ions are not implanted in the region shielded by the photoresist 107, which has a thickness greater than the stopping power when viewed from the direction of the ion source. As a result, ions are implanted into the side walls and the implanted upper surface region of the mesa portion 12 and the like to form the first guard ring 104a.

In the flat portions 11 of the access layer 103, the photoresist 107 on the flat portions 11 suppresses ion implantation. Therefore, the second guard ring 104b is not formed on the flat portions 11.

Also in the second embodiment, it is preferable to perform ion implantation at at least two rotation angles with respect to the longitudinal direction of the mesa portion 12, or to perform ion implantation while rotating the wafer. And, the tilt angle θ is preferably 60° or less.

In the second embodiment, the profile of the guard ring from the front surface of the semiconductor layer such as a mesa portion 12 can be continuously shallowed depending on the mask material, ion species, acceleration voltage, and mask pattern. Therefore, a realization of the high breakdown voltage structure with a reduced singularity can be expected.

The method of forming the photoresist 107 exposing only the upper portion of the mesa portion 12 as illustrated in FIG. 8 is not limited to the above. For example, known methods such as chemical mechanical polishing (CMP), etchback and the like can be used.

The anode electrode 105 is then formed on the non-implanted upper surface region of the drift layer 102, as illustrated in FIG. 9. The connection between the anode electrode 105 and the drift layer 102 is preferably Schottky contact. It should be noted that although the anode electrode 105 is formed by lifting-off in FIG. 9, the patterning of the electrode is not limited to lifting-off, and known methods such as ion milling, dry processing, and wet processing can also be used.

<Summary of Second Embodiment>

According to the second embodiment as described above, the first guard ring 104a on the side walls of the mesa portion 12 is arranged relatively deep; therefore, enhancement in the electric field relaxation and breakdown voltage property of the semiconductor device is ensured. Meanwhile, the guard ring is not arranged in the flat portions 11; therefore, suppression of an increase in parasitic resistance and parasitic capacitance of the semiconductor device is ensured.

Third Embodiment

Figure 10:
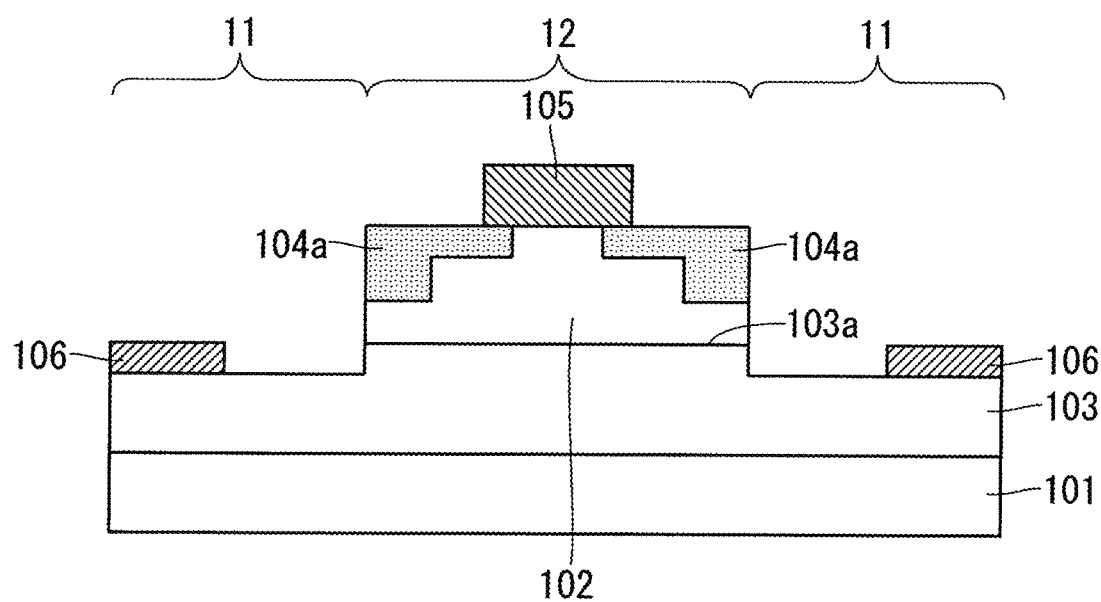
FIG. 10 A schematic cross-sectional view illustrating a configuration of a semiconductor device according to a third embodiment.

FIG. 10 is a schematic cross-sectional view illustrating a configuration of a semiconductor device according to a third embodiment. The third embodiment is obtained by changing the configuration of the cathode electrode in the configuration of the second embodiment, and the changes will be mainly described below. It should be noted that the configuration of the cathode electrode may be changed in the same manner as described below, not only in the configuration of the second embodiment, but also in the configuration of the first embodiment.

In the third embodiment, the cathode electrode 106 is arranged not on the semiconductor substrate 101 but on the flat portions 11 of the access layer 103. In other words, the semiconductor device according to the third embodiment has a lateral structure in which the anode electrode 105 and the cathode electrode 106 are arranged on the same side with respect to access layer 103.

When flat portions 11 contain a nitride semiconductor and contact is made from the upper surfaces of flat portions 11, the access layer 103 is exposed from the drift layer 102 by processing such as etching, and the electrodes are brought into ohmic contact with the exposed access layer 103. At this point, preferably, a practical ohmic contact can be easily obtained with the concentration of the access layer 103, or at least the concentration of the surface of the access layer 103 being set to $5.0 \times 10^{18}$ cm$^{-3}$ or more.

<Manufacturing Method>

Figure 11:
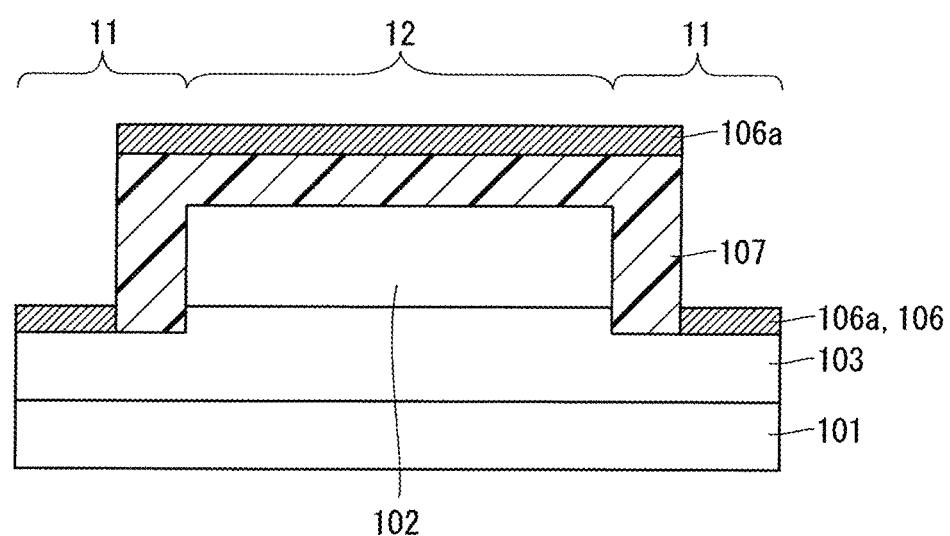
FIG. 11 A schematic cross-sectional view for illustrating a method of manufacturing the semiconductor device according to the third embodiment.

FIG. 11 is a schematic cross-sectional view for illustrating a method of manufacturing the semiconductor device according to the third embodiment. Next, the method of manufacturing the semiconductor device according to the third embodiment will be described.

First, the same steps as those illustrated in FIGS. 2 and 3 of the first embodiment are performed. The cathode electrode 106 is then formed on the flat portions 11 of the access layer 103, as illustrated in FIG. 11. In FIG. 11, although the cathode electrode 106 is formed from the metal 106a by lifting-off, the electrode patterning is not limited to lifting-off, and known methods such as ion milling, dry processing, and wet processing are also used.

In order to obtain an ohmic contact in the exemplified nitride semiconductor, the upper surfaces of the flat portions 11 may be previously subjected to ion implantation and activation annealing treatment, or subjected to alloy treatment after forming an electrode such as the cathode electrode 106. In order to suppress the change in characteristics of the guard ring, the guard ring is preferably formed after forming the cathode electrode 106, as described in the first embodiment.

<Summary of Third Embodiment>

According to the third embodiment described above, the anode electrode 105 and the cathode electrode 106 are arranged on the same side with respect to access layer 103. Therefore, the resistance and the parasitic capacitance of the access layer 103 can be reduced. In addition, the dimensions of the active region can be determined with accuracy as good as that of photolithography, allowing for designing of a precise breakdown voltage and resistance.

Fourth Embodiment

Figure 12:
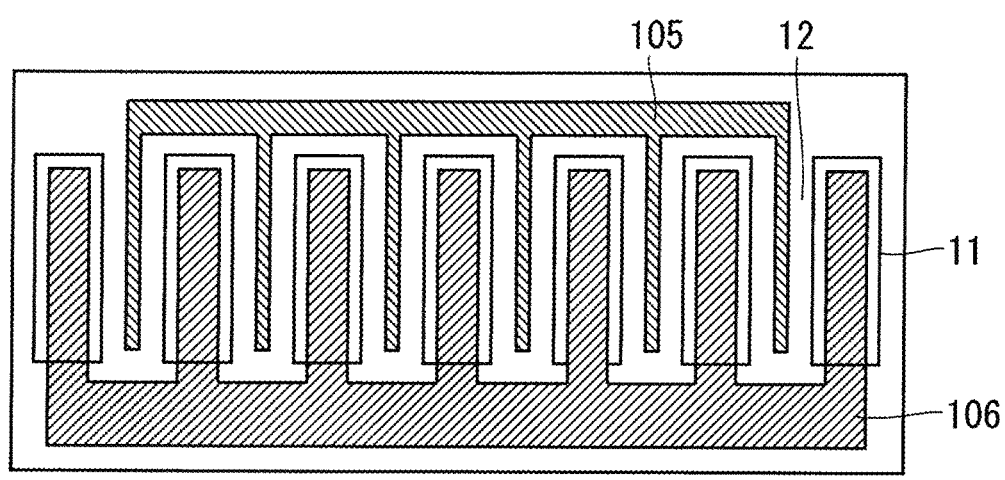
FIG. 12 A schematic plan view illustrating a configuration of a semiconductor device according to a fourth embodiment.

FIG. 12 is a schematic plan view illustrating a configuration of a semiconductor device according to a fourth embodiment. The fourth embodiment relates to a layout of the anode electrode 105 and the cathode electrode 106 in the lateral structure diode of the third embodiment, and the layout will be mainly described below.

As illustrated in FIG. 12, the anode electrode 105 and the cathode electrode 106 have a comb-shaped finger structure where they mesh with each other in plan view viewed from the upper surface of the chip. The comb teeth of a comb shape of the anode electrode 105 and the comb teeth of a comb shape of the cathode electrode 106 are laid out so as to be parallel and opposed to each other. Also, the mesa portions 12, which are the semiconductor active region, and the flat portions 11, which are the bottom surfaces of the trenches, are laid out so as to be parallel and opposed to each other. The longitudinal direction of mesa portions 12 and the extending direction of flat portions 11 correspond to each other.

Part or all of the anode electrode 105 is arranged on the mesa portions 12, and part or all of the cathode electrode 106 is arranged on the flat portions 11. FIG. 12 illustrates a structure in which all of the anode electrode 105 is arranged on the mesa portions 12 and part of the cathode electrode 106 is arranged on the flat portions 11.

<Summary of Fourth Embodiment>

According to the fourth embodiment as described above, the anode width, which is the length in the longitudinal direction of the fingers of the anode electrode 105 and the cathode electrode 106 opposite to each other, can be increased. This reduces the resistance of the semiconductor device and increases the current per chip area.

Fifth Embodiment

The fifth embodiment relates to the formation of the guard ring among the methods of manufacturing the semiconductor devices described above, and the formation thereof will be mainly described below.

If the tilt angle θ is too large, ion implantation into portions of mesa portion 12 and the flat portions 11 to be ion implanted may be hindered in some cases depending on the shape of the side walls of the mesa portion 12, the mask thickness, and the shape of the mask, with these factors acting as a mask. Therefore, ion implantation from the longitudinal direction of the mesa portion 12 is preferable, and it is preferable to select an appropriate rotation angle that does not cause planar channeling, that is, an appropriate wafer rotation angle.

Therefore, in the fifth embodiment, the tilt angle θ is set to 30° or more with respect to a 3 μm thick photoresist having a typical stopping power. In plan view, the rotation angle formed between the direction of ion implantation and the longitudinal direction of the mesa portion 12 is −35° or more and 35° or less. It is preferable to perform ion implantation at at least two rotation angles with respect to the longitudinal direction of the mesa portion 12, or to perform ion implantation while rotating the wafer.

<Summary of Fifth Embodiment>

According to the fifth embodiment, even if the ion implantation is performed at a relatively large tilt angle θ in order to control the depth of ion implantation from the semiconductor layer surface of the side wall of the mesa portion 12 and the flat portion 11, the suppression of the influence of the shape of the mesa portion 12 and the thickness of the mask is ensured. For example, the rotation angle formed between the direction of ion implantation and the longitudinal direction of the mesa portion 12 being −35° or more and 35° or less suppresses shading to about 1 μm.

Sixth Embodiment

Figure 13:
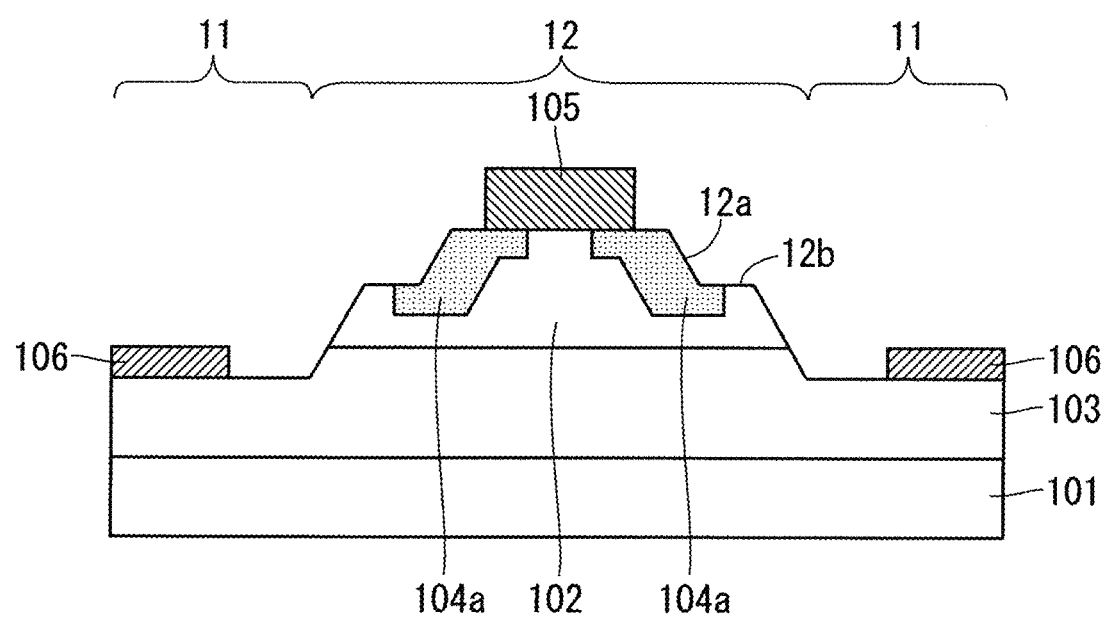
FIG. 13 A schematic cross-sectional view illustrating a configuration of a semiconductor device according to a sixth embodiment.

FIG. 13 is a schematic cross-sectional view illustrating a configuration of a semiconductor device according to a sixth embodiment. The sixth embodiment is obtained by changing the configuration of the side walls of the mesa portion 12 in the configuration of the third embodiment, and the changes will be mainly described below.

As illustrated in FIG. 13, a side wall of the mesa portion 12 according to the sixth embodiment includes an inclined surface 12a and a terrace surface 12b. The inclined surface 12a is inclined toward inward the mesa portion 12 toward the tip of the mesa portion 12. The terrace surface 12b extends in a direction corresponding to the in-plane direction of the drift layer 102. The direction corresponding to the in-plane direction of the drift layer 102 includes a direction parallel to the in-plane direction of the drift layer 102 and a direction substantially parallel to the in-plane direction of the drift layer 102. In the following description, although it is assumed that the terrace surface 12b is a flat surface, the surface may have some irregularities.

The first guard ring 104a is provided from the upper surface of the mesa portion 12 to the terrace surface 12b, while no guard ring is provided between the terrace surface 12b and the flat portion 11 of the access layer 103.

Here, in general, when the anode electrode 105 and the cathode electrode 106 are separated in order to secure a sufficient alignment margin, the parasitic capacitance and the parasitic resistance increase. Meanwhile, according to the sixth embodiment, an effect equivalent to that of the first embodiment and the like is obtained, and an alignment margin for photolithography can be secured by the terrace surface 12b even if the anode electrode 105 and the cathode electrode 106 are not separated more than necessary. Therefore, the increase in parasitic capacitance and parasitic resistance can be suppressed.

The sixth embodiment is also significant in forming a field plate for improving breakdown voltage. The field plate is effective in relaxing the electric field, but increases the parasitic capacitance. This increase in parasitic capacitance is not preferable because it causes a decrease in the operating band. Enhancement of photolithographic alignment is required to avoid increase in unnecessary parasitic capacitance and to arrange the proper length field plate in the proper area. In contrast, according to the sixth embodiment, the alignment margin for photolithography can be secured by the terrace surface 12b, so that the field plate can be arranged on the side wall of the mesa portion 12 with an appropriate length. Also, by providing a plurality of steps of terrace surfaces 12b on the side wall of the mesa portion 12, a guard ring and a field plate each having an optimum length can be arranged.

<Manufacturing Method>

In a manufacturing method of the sixth embodiment, the step of forming the drift layer 102 in the manufacturing method of the first embodiment is divided into a plurality of steps. Specifically, a photoresist or a dielectric such as SiN or SiO is patterned as a processing mask, and a portion of the drift layer 102 is processed by dry processing, wet processing, lifting-off, or the like to form the base portion of the mesa portion 12. Next, using a mask having a narrower width than the width of the mask used to form the base portion of the mesa portion 12, parts of the base portion of the mesa portion 12 are patterned, thereby forming the mesa portion 12 having the inclined surfaces 12a and the terrace surfaces 12b. As will be described below, a processing mask whose width is narrow may also be formed by narrowing an existing photomask by isotropic processing such as wet processing.

FIGS. 14 to 19 are schematic cross-sectional views for illustrating a method of manufacturing the semiconductor device according to the sixth embodiment. Hereinafter, the parts of manufacturing method according to the sixth embodiment that are different from the manufacturing method described above will be mainly described.

Figure 14:
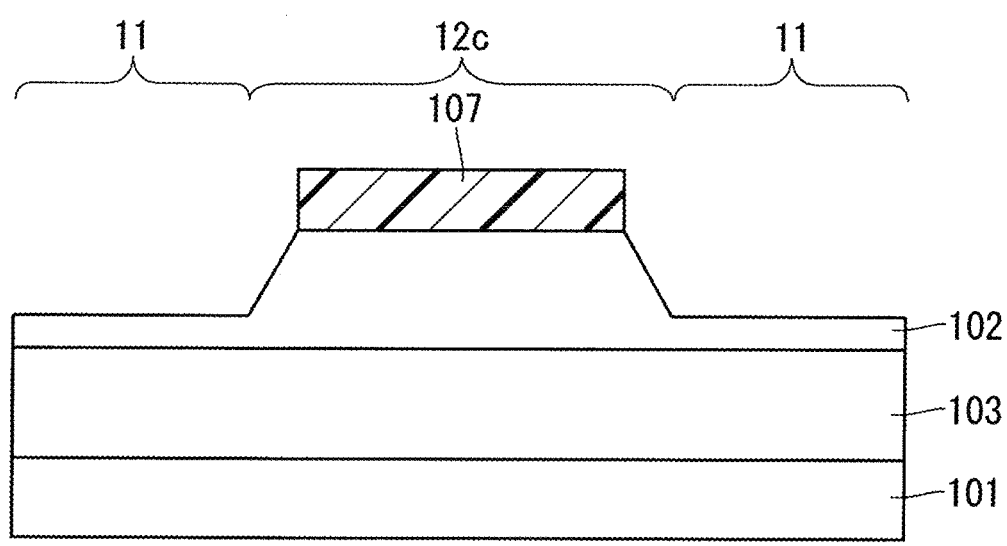
FIG. 14 A schematic cross-sectional view for illustrating a method of manufacturing the semiconductor device according to the sixth embodiment.

First, the same step as that illustrated in FIG. 2 of the first embodiment is performed. Then, as illustrated in FIG. 14, the access layer 103 is partially exposed from the drift layer 102 to form a base portion 12c of the mesa portion 12. The side walls of the base portion 12c are inclined toward inward the base portion 12c toward the tip of the base portion 12c.

Then, as illustrated in FIG. 15, the photoresist 107 used for forming the base portion 12c is subjected to isotropic processing such as wet processing to form a narrowed photoresist 107a.

Figure 16:
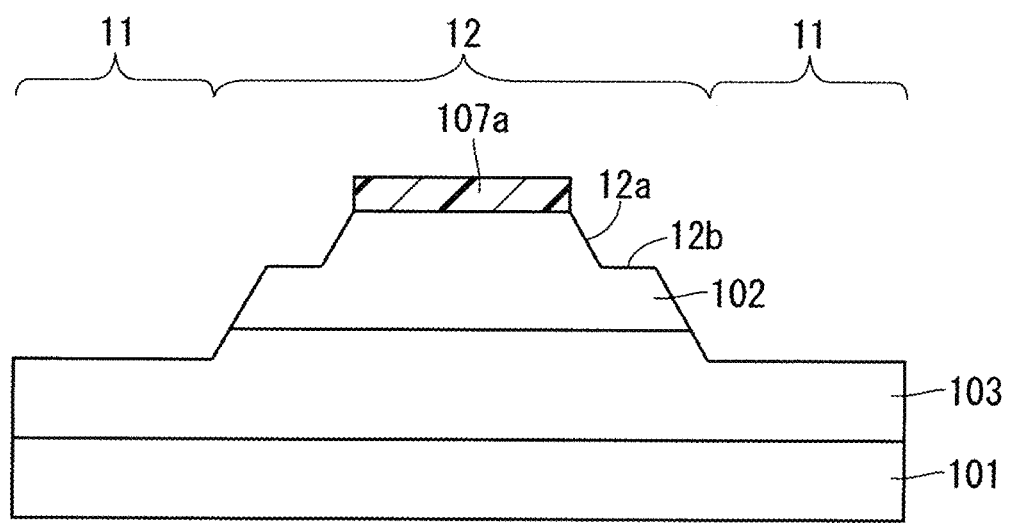
FIG. 16 A schematic cross-sectional view for illustrating the method of manufacturing the semiconductor device according to the sixth embodiment.

Next, as illustrated in FIG. 16, using the photoresist 107a as a mask, a part of the drift layer 102 is patterned. Thereby, the mesa portion 12 having the inclined surfaces 12a and the terrace surfaces 12b is formed from the base portion 12c. In the example of FIG. 16, the flat portions 11 are also patterned along with the mesa portion 12.

As illustrated in FIG. 17, the cathode electrode 106 is formed on the flat portions 11 of the access layer 103 by performing the same step as the step of FIG. 11 of the third embodiment.

Next, as illustrated in FIG. 18, only the portions above the terrace surfaces 12b of the mesa portion 12 are exposed from the photoresist 107 by performing the same step as the step illustrated in FIG. 8 of the second embodiment. Then, ions being p-type impurities are implanted into the exposed portions. Thereby, the first guard ring 104a is formed from the upper surface of the mesa portion 12 to the terrace surfaces 12b.

As illustrated in FIG. 19, the anode electrode 105 is formed on the non-implanted upper surface region of the drift layer 102 by performing the same step as the step of FIG. 6 of the first embodiment.

<Summary of Sixth Embodiment>

A side wall of the mesa portion 12 according to the sixth embodiment includes the inclined surface 12a and the terrace surface 12b. According to such a configuration, an alignment margin for photolithography can be secured by the terrace surface 12b even if the anode electrode 105 and the cathode electrode 106 are not separated more than necessary; therefore, the increase in parasitic capacitance and parasitic resistance can be suppressed.

Seventh Embodiment

The seventh embodiment is obtained by changing the inclined surfaces 12a and the terrace surfaces 12b in the configuration of the sixth embodiment, and the changes will be mainly described below.

As with the ion implantation depth of the side walls of the mesa portion 12 and the flat portions 11, the ion implantation depths of the inclined surfaces 12a and the terrace surfaces 12b also depends on the angle formed between the tilt angle θ and the inclined surface 12a and the angle formed between the tilt angle θ the terrace surface 12b, respectively. In the seventh embodiment, the angle formed between the inclined surface 12a and the terrace surface 12b is set at greater than 60° and smaller than 90° in order for ions to be implanted deeply into the inclined surface 12a and for ions to be implanted shallowly into the terrace surface 12b while avoiding shading. Also in the seventh embodiment, as described above, attention should be paid to the rotation angle in order to suppress shading due to the mesa portion 12 and the mask.

<Summary of Seventh Embodiment>

According to the seventh embodiment as described above, the angle formed between the inclined surface 12a and the terrace surface 12b is greater than 60° and smaller than 90°. Therefore, by appropriately controlling the tilt angle θ, the depth of the first guard ring 104a in the inclined surfaces 12a can be made deeper than the depth of the first guard ring 104a in the terrace surfaces 12b. In addition, the distance between the anode electrode 105 and the cathode electrode 106 can be optimized while setting the depth of the mesa portion 12 to an appropriate depth, so that the increase in resistance of the access layer 103 can be suppressed.

Eighth Embodiment

The eighth embodiment is obtained by changing the terrace surfaces 12b in the configurations of the sixth embodiment and the seventh embodiment, and the changes will be mainly described below.

If the above-described terrace surface 12b is too wide, the distance through which carriers flow in the access layer 103 electrically connecting the anode electrode 105 and the cathode electrode 106 increases, resulting in increased parasitic resistance and parasitic capacitance. Therefore, in the eighth embodiment, the length of the terrace surface 12b in the lateral direction of the mesa portion 12 is set to 0.2 μm or more and 1.0 μm or less.

<Summary of Eighth Embodiment>

According to the eighth embodiment as described above, suppression of an increase in parasitic resistance while suppressing a decrease in photolithography alignment margin is ensured.

Ninth Embodiment

In the ninth embodiment, the semiconductor substrate 101 is semi-insulating. Using such a semi-insulating semiconductor substrate 101 reduces parasitic capacitance, and also, dielectric isolation between elements can be achieved when the integrated elements are manufactured. Particularly in the ninth embodiment, the specific resistance of semiconductor substrate 101 is 1 k (2 cm or more. According to such a configuration, sufficient reduction in the pad capacitance and a sufficient insulation resistance can be obtained even with the lateral structure illustrated in the third embodiment. Therefore, the application of the semiconductor device according to the third embodiment to a high-frequency device and a power device is ensured.

Note that when the semi-insulating semiconductor substrate 101 is used as a heterogeneous substrate, there are limitations in the film thickness in film formability of the drift layer 102 and the access layer 103 due to differences in lattice constant and thermal expansion coefficient. Also, the upper limit of the film thickness in film formability changes depending on the impurity concentrations of the drift layer 102 and the access layer 103.

MODIFICATION EXAMPLE

The scope to which the present disclosure is applied is not particularly limited and the scope of the present disclosure is applicable to a power supply system, a power transmission system, and a power conversion system for devices that require power (PCs, home appliances, lighting equipment, routers, radars, antennas, etc.), structures (detached houses, condominiums, buildings, station buildings, data centers, wireless base stations, etc.), and moving objects (automobiles, motorcycles, bicycles, trains, ships, aircraft, etc.), for example.

The embodiments and the modification example can be combined, and the embodiments and the modification example can be appropriately modified or omitted.

The foregoing description is in all aspects illustrative and not restrictive. It is therefore understood that numerous modifications and variations can be devised without departing from the scope of the disclosure.

EXPLANATION OF REFERENCE SIGNS

11 flat portion, 12 mesa portion, 12a inclined surface, 12b terrace surface, 101 semiconductor substrate, 102 drift layer, 103 access layer, 103a adjacent portion, 104a first guard ring, 104b second guard ring, 105 anode electrode, 106 cathode electrode.

The invention claimed is:

1. A semiconductor device comprising:
a first semiconductor layer of a first conductivity type; and
a second semiconductor layer of the first conductivity type having impurity concentration of the first conductivity type higher than that of the first semiconductor layer and having an adjacent portion being a portion adjacent to the first semiconductor layer, the portion being covered by the first semiconductor layer, wherein
a portion of the second semiconductor layer exposed from the first semiconductor layer corresponds to a concave portion of a laminated structure of the first semiconductor layer and the second semiconductor layer,
the first semiconductor layer or the first semiconductor layer and the adjacent portion of the second semiconductor layer corresponds to a convex portion of the laminated structure,
a first guard ring of a second conductivity type is arranged on side walls of the convex portion, a lowest portion of the first guard ring being above a highest portion of a second guard ring, and
the second guard ring of the second conductivity type is arranged in the concave portion, a thickness of the second guard ring being less than a thickness of the first guard ring.

2. The semiconductor device according to claim 1, further comprising:
a first electrode arranged on the convex portion and establishing Schottky contact with the convex portion; and
a second electrode arranged on the concave portion and establishing ohmic contact with the concave portion.

3. The semiconductor device according to claim 2, wherein
the first electrode and the second electrode have a comb shape where they mesh with each other in plan view, and comb teeth of the comb shape of the first electrode and comb teeth of the comb shape of the second electrode are in parallel and opposed to each other.

4. The semiconductor device according to claim 1, wherein
the side walls of the convex portion include
an inclined surface inclined toward inward the convex portion toward a tip of the convex portion, and
a terrace surface extending in a direction corresponding to an in-plane direction of the second semiconductor layer.

5. The semiconductor device according to claim 4, wherein
an angle formed between the inclined surface and the terrace surface is greater than 60° and smaller than 90°.

6. The semiconductor device according to claim 4, wherein
a length of the terrace surface in a lateral direction of the convex portion is set to 0.2 μm or more and 1.0 μm or less.

7. The semiconductor device according to claim 1, further comprising
a semiconductor substrate arranged on a portion of the second semiconductor layer on an opposite side to the first semiconductor layer and having a specific resistance of 1 kΩcm or more.

8. The semiconductor device according to claim 1, wherein the first guard ring is separated from the second semiconductor layer by the first semiconductor layer.

9. The semiconductor device according to claim 1, wherein the thickness of the first guard ring is measured from a highest portion of the first guard ring to a lowest portion of the first guard ring and is less than a thickness of the first semiconductor layer.

10. A method of manufacturing a semiconductor device, wherein
the semiconductor device includes
a first semiconductor layer of a first conductivity type, and
a second semiconductor layer of the first conductivity type having impurity concentration of the first conductivity type higher than that of the first semiconductor layer and having an adjacent portion being a portion adjacent to the first semiconductor layer, the portion being covered by the first semiconductor layer, wherein
a portion of the second semiconductor layer exposed from the first semiconductor layer corresponds to a concave portion of a laminated structure of the first semiconductor layer and the second semiconductor layer,
the first semiconductor layer or the first semiconductor layer and the adjacent portion of the second semiconductor layer corresponds to a convex portion of the laminated structure,
a first guard ring of a second conductivity type is arranged on side walls of the convex portion, a lowest portion of the first guard ring being above a highest portion of a second guard ring,
in the concave portion, the second guard ring of the second conductivity type is arranged in the concave portion and a thickness of the second guard ring is less than a thickness of the first guard ring, and
in the method of manufacturing,
the first guard ring is formed by ion implantation, and
a tilt angle formed between a direction of the ion implantation and an out-of-plane direction of the first semiconductor layer is 30° or more in cross-sectional view.

11. A method of manufacturing a semiconductor device, wherein the semiconductor device includes a first semiconductor layer of a first conductivity type, and a second semiconductor layer of the first conductivity type having impurity concentration of the first conductivity type higher than that of the first semiconductor layer and having an adjacent portion being a portion adjacent to the first semiconductor layer, the portion being covered by the first semiconductor layer, wherein a portion of the second semiconductor layer exposed from the first semiconductor layer corresponds to a concave portion of a laminated structure of the first semiconductor layer and the second semiconductor layer, the first semiconductor layer or the first semiconductor layer and the adjacent portion of the second semiconductor layer corresponds to a convex portion of the laminated structure, a first guard ring of a second conductivity type is arranged on side walls of the convex portion, a lowest portion of the first guard ring being above a highest portion of a second guard ring, in the concave portion, the second guard ring of the second conductivity type is arranged in the concave portion and a thickness of the second guard ring is less than a thickness of the first guard ring, and in the method of manufacturing, the first guard ring is formed by ion implantation, and a rotation angle formed between a direction of the ion implantation and a longitudinal direction of the convex portion is −35° or more and 35° or less in plan view.

* * * * *